United States Patent
Tsuyutani

(10) Patent No.: US 10,917,974 B2
(45) Date of Patent: Feb. 9, 2021

(54) CIRCUIT BOARD INCORPORATING ELECTRONIC COMPONENT AND MANUFACTURING METHOD THEREOF

(71) Applicant: TDK Corporation, Tokyo (JP)

(72) Inventor: Kazutoshi Tsuyutani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 340 days.

(21) Appl. No.: 14/054,556

(22) Filed: Oct. 15, 2013

(65) Prior Publication Data

US 2014/0104803 A1 Apr. 17, 2014

(30) Foreign Application Priority Data

Oct. 17, 2012 (JP) ................. 2012-229704

(51) Int. Cl.
*H05K 5/00* (2006.01)
*H05K 1/18* (2006.01)
(Continued)

(52) U.S. Cl.
CPC ............. *H05K 1/185* (2013.01); *H01L 24/24* (2013.01); *H01L 24/82* (2013.01); *H05K 1/115* (2013.01); *H05K 3/30* (2013.01); *H05K 3/42* (2013.01); *H01L 2224/04105* (2013.01); *H01L 2224/24226* (2013.01); *H01L 2224/32225* (2013.01);
(Continued)

(58) Field of Classification Search
CPC ...... H05K 1/185; H05K 2201/10; H05K 1/03; H05K 1/0313; H05K 2201/10613; H05K 2201/1075; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/095; H01L 23/14; H01L 23/145; H01L 21/02063; H01L 23/481; H01L 23/5226; H01L 23/5283; H01L 23/3107; H01L 33/56
USPC ....... 361/761, 762, 772, 773, 774, 767, 783, 361/803; 174/260, 534, 531, 557, 262, 174/265, 266; 257/774, 787, 700, 690, 257/692, 693, 697, 698, E23.004, 257/E23.178

See application file for complete search history.

(56) References Cited

U.S. PATENT DOCUMENTS 5,081,563 A * 1/1992 Feng ................ H01L 23/13
174/260
5,875,100 A 2/1999 Yamashita
(Continued)

FOREIGN PATENT DOCUMENTS

| JP | 9-321408 A | 12/1997 |
|---|---|---|
| JP | 2002-246500 A | 8/2002 |
| JP | 2012-9602 | 1/2012 |

*Primary Examiner* — Binh B Tran
(74) *Attorney, Agent, or Firm* — McDermott Will & Emery LLP

(57) ABSTRACT

Disclosed herein is a circuit board that includes a resin substrate including a substrate wiring layer, and an electronic component embedded in the resin substrate and having a plurality of external electrodes. The resin substrate includes a plurality of via holes that expose the external electrodes and a plurality of via conductors embedded in the via holes to electrically connect the substrate wiring layer to the external electrodes. At least some of the via holes are different in planar shape from each other.

17 Claims, 8 Drawing Sheets

(51) Int. Cl.
*H05K 3/42* (2006.01)
*H05K 3/30* (2006.01)
*H05K 1/11* (2006.01)
*H01L 23/00* (2006.01)

(52) U.S. Cl.
CPC ............... *H01L 2224/73267* (2013.01); *H01L 2224/8203* (2013.01); *H01L 2224/92244* (2013.01); *H01L 2924/15313* (2013.01); *H05K 2201/09727* (2013.01); *H05K 2201/09854* (2013.01); *H05K 2203/1469* (2013.01); *Y10T 29/49146* (2015.01)

(56) References Cited

U.S. PATENT DOCUMENTS

| | | | | |
|---|---|---|---|---|
| 2007/0263364 | A1* | 11/2007 | Kawabe | H01L 23/49822 361/728 |
| 2009/0242252 | A1* | 10/2009 | Tanaka | H01L 24/19 174/260 |
| 2013/0026632 | A1* | 1/2013 | Kikuchi | H01L 23/552 257/753 |
| 2013/0319747 | A1* | 12/2013 | Hurwitz | H01L 23/49822 174/262 |

* cited by examiner

CIRCUIT BOARD INCORPORATING ELECTRONIC COMPONENT AND MANUFACTURING METHOD THEREOF

BACKGROUND OF THE INVENTION

Field of the Invention

The present invention relates to a circuit board incorporating an electronic component and a manufacturing method thereof, and in particular to a circuit board incorporating an electronic component that can lower costs, be made thinner, and have higher performance and a manufacturing method thereof.

Description of Related Art

As for a typical printed-circuit board, a plurality of electronic devices such as semiconductor ICs are mounted on a surface of the circuit board. The electronic devices mounted on the circuit board are electrically connected via a wiring layer provided inside the circuit board. However, it is difficult to make a printed-circuit board of such a type thinner as a whole. Therefore, as a printed-circuit board for devices such as smartphones that are required to be thin, a circuit board of a type in which electronic components such as semiconductor ICs are embedded in a resin layer may be used.

For example, what is disclosed in Japanese Patent Application Laid-Open No. H9-321408 is a method of manufacturing a circuit board incorporating a semiconductor IC by fitting a semiconductor IC into a concave section provided on a resin substrate and then exposing stud bumps provided on the semiconductor IC. What is disclosed in Japanese Patent Application Laid-Open No. 2002-246500 is a method of connecting pad electrodes of the semiconductor IC to a wiring layer of the resin substrate by irradiating the resin substrate, in which the semiconductor IC is embedded, with a laser beam to expose an external electrode provided on the semiconductor IC.

However, according to the circuit board incorporating a semiconductor IC disclosed in Japanese Patent Application Laid-Open Nos. H9-321408 and 2002-246500, stud bumps, a transition layer, or the like needs to be formed in advance on the pad electrodes of the semiconductor ICs, leading to an increase in production costs. Another problem with the circuit board incorporating a semiconductor IC disclosed in Japanese Patent Application Laid-Open Nos. H9-321408 and 2002-246500 is that the existence of the stud bumps, the transition layer, or the like makes it difficult to make the boards thinner as a whole. Furthermore, in the circuit board incorporating a semiconductor IC disclosed in Japanese Patent Application Laid-Open Nos. H9-321408 and 2002-246500, the diameter and shape of all via conductors that are connected to the pad electrodes of the semiconductor ICs are the same as one another. Therefore, for example, it is difficult to improve characteristics, such as lowering the resistance of a specific power supply line. The problems can occur not only for the circuit board incorporating a semiconductor IC, but also for general circuit boards in which electronic components other than semiconductor ICs are embedded.

SUMMARY

It is therefore an object of the present invention to provide a circuit board that can lower costs, be made thinner, and have higher performance, and a manufacturing method thereof.

In one aspect of the present invention, there is provided a circuit board that includes: a resin substrate including a substrate wiring layer; and an electronic component embedded in the resin substrate and having a plurality of external electrodes. The resin substrate includes a plurality of via holes that expose the external electrodes and a plurality of via conductors embedded in the via holes to electrically connect the substrate wiring layer to the external electrodes, at least some of the via holes being different in planar shape from each other.

According to the present invention, since at least some of the plurality of via holes are different in planar shape from each other, it is, for example, possible to lower the resistance of a predetermined via conductor. As a result, a higher-performance circuit board can be provided.

In the circuit board of the present invention, the electronic component is preferably a semiconductor IC. Since the semiconductor IC has a large number of external electrodes of different types, such as power-supply external electrodes and external electrodes for signals, the shape and size of the via holes can be selected in accordance with the type and shape of the external electrodes. As a result, it is possible to further improve the performance of the circuit board.

In this case, the semiconductor IC preferably includes a plurality of chip wiring layers including a top wiring layer that is uppermost one of the chip wiring layers, the external electrodes are preferably provided on the top wiring layer, and the semiconductor IC preferably includes an internal wiring line provided on the top wiring layer, the internal wiring line being free from connected to any of the external electrodes at least on the top wiring layer. Because so-called pad layers are not provided in the semiconductor IC, it is possible to eliminate the cost of forming the pad layers. Moreover, the thickness can be further reduced because the pad layers do not exist. In this case, the top wiring layer may be in contact with a resin layer included in the resin substrate.

In the circuit board of the present invention, the external electrodes preferably includes a first external electrode and a second external electrode that is smaller in size than the first external electrode, the via holes preferably includes a first via hole and a second via hole that is smaller in size than the first via hole. The first via hole is assigned to the first external electrode, and the second via hole is assigned to the second external electrode. In this manner, depending on the size of the external electrodes, the via conductors can be maximized in size.

In this case, the first external electrode is preferably a power-supply electrode, and the second external electrode is an electrode for signal. As a result, it is possible to lower the resistance of a power-supply via conductor.

In the circuit board of the present invention, a predetermined one of the via holes have a planar shape that is in line with an outer shape of an associated one of the external electrodes. As a result, it is possible to maximize the size of via conductors.

In this case, the associated one of the external electrodes includes a first electrode portion extending in a first direction and a second electrode portion extending in a second direction that crosses the first direction, and the predetermined one of the via holes includes a first opening exposing the first electrode portion and a second opening exposing the second electrode portion. According to this feature, even when the external electrodes are not well shaped and are in different shapes such as a L-shape, U-shape, or H-shape, it is possible to maximize the size of via conductors.

In another aspect of the present invention, there is provided a manufacturing method of a circuit board, the method includes: embedding an electronic component in a resin substrate having substrate wiring layer; forming a plurality of via holes in the resin substrate to expose a plurality of external electrodes provided on the electronic component so that at least some of the via holes are different in planer shape from each other; and forming a plurality of via conductors each fills an associated one of the via holes to connect the substrate wiring layer to the external electrodes.

According to the present invention, since at least some of the plurality of via holes are different in planer shape from each other, it is, for example, possible to lower the resistance of a predetermined via conductor. As a result, a higher-performance circuit board can be provided.

In the manufacturing method of a circuit board, the forming the via holes includes: removing a part of the substrate wiring layer; and blasting the substrate wiring layer to form the plurality of via holes by using the substrate wiring layer as a mask. According to this feature, it is possible to form a plurality of via holes of different shapes or sizes at once.

In the manufacturing method of a circuit board, the electronic component is preferably a semiconductor IC. As described above, since the semiconductor IC has a large number of external electrodes of different types, such as power-supply external electrodes and external electrodes for signals, the shape and size of the via holes can be selected in accordance with the type and shape of the external electrodes. As a result, it is possible to further improve the performance of the circuit board.

In this case, the semiconductor IC preferably includes a plurality of chip wiring layers including a top wiring layer that is uppermost one of the chip wiring layers, the external electrodes are preferably provided on the top wiring layer, and the semiconductor IC preferably includes an internal wiring line provided on the top wiring layer, the internal wiring line being free from connected to any of the external electrodes at least on the top wiring layer. Because so-called pad layers are not provided in the semiconductor IC, it is possible to eliminate the cost of forming the pad layers. Moreover, the thickness can be further reduced because the pad layers do not exist.

As described above, according to the present invention, it is possible to provide an circuit board that can lower costs, be made thinner, and have higher performance, and a production method thereof.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

A preferred embodiments of the present invention will now be explained in detail with reference to the drawings.

Figure 1:
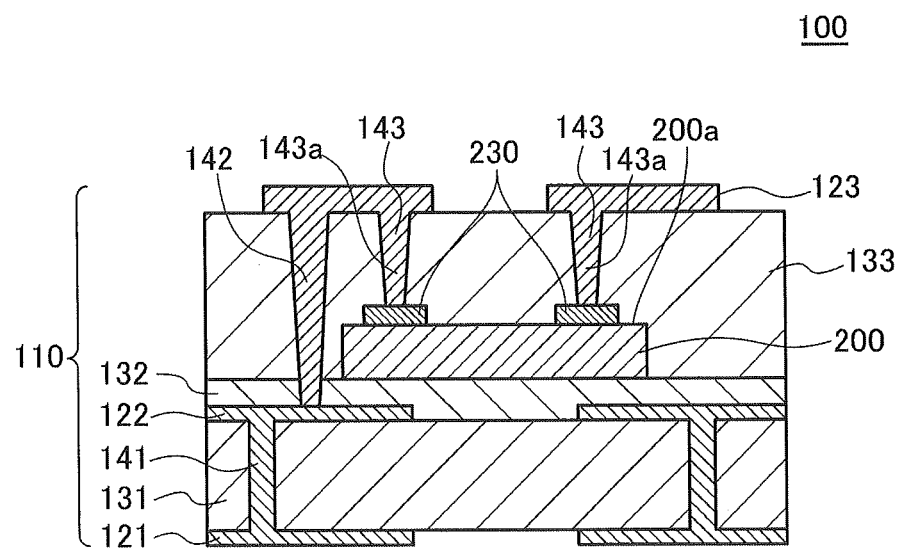
FIG. 1 is a schematic cross-sectional view showing the configuration of an circuit board according to a preferred embodiment of the present invention.

FIG. 1 is a schematic cross-sectional view showing the configuration of an circuit board 100 according to a preferred embodiment of the present invention. Incidentally, positional relationships, such as upper, lower, left and right, are based on the positional relationships shown in the diagrams unless otherwise stated. The dimensions and ratios of the drawings are not limited to the ratios shown in the diagrams. Moreover, the following embodiment is illustrated to explain the present invention, and the present invention is not intended to be limited to only the embodiment. Furthermore, the present invention can be modified in various ways without departing from the spirit thereof.

As shown in FIG. 1, the circuit board 100 of the present embodiment includes a resin substrate 110 and a semiconductor IC 200 that is embedded in the resin substrate 110. The semiconductor IC 200 is in a bare-chip state. Although not specifically limited, the thickness of the semiconductor IC 200 is made thinner so as to be, for example, 200 μm or less, and more preferably about 50 to 100 μm. The type of the semiconductor IC 200 is not specifically restricted; digital ICs whose operating frequency is very high, such as CPU (Central Processing Unit) or DSP (Digital Signal Processor), memory-type ICs, such as F-Rom or SDRAM (Synchronous Dynamic Random Access Memory), and analog ICs, such as a high-frequency amplifier, antenna switch, and high-frequency oscillation circuit, are available.

In the resin substrate 110, three substrate wiring layers 121, 122 and 123 are provided. A resin layer 131 is provided between the substrate wiring layers 121 and 122. Resin layers 132 and 133 are provided between the substrate wiring layers 122 and 123. The substrate wiring layer 121 is a wiring layer that is exposed to one surface (lower surface) of the resin substrate 110. The substrate wiring layer 123 is a wiring layer that is exposed to the other surface (upper surface) of the resin substrate 110. The substrate wiring layer 122 is a wiring layer that is embedded inside the resin substrate 110. The substrate wiring layers 121 and 122 are electrically connected through via conductors 141 that are so provided as to pass through the resin layer 131. The substrate wiring layers 122 and 123 are electrically connected through a via conductor 142 that is so provided as to pass through the resin layers 132 and 133.

The semiconductor IC 200 is placed face-up on the resin layer 132 so as to be embedded in the resin layer 133. A chip wiring layer having a plurality of external electrodes 230 is provided on a surface 200a that is a main surface of the semiconductor IC 200. While the details will be described later, the semiconductor IC 200 used in the present embodiment is different from a typical semiconductor IC. That is, electrodes that are defined as so-called pad electrodes are not provided, and wiring lines that are formed on the top chip wiring layer are directly used as external electrodes 230. The external electrodes 230 are exposed through a plurality of via holes 143a that are provided in the resin layer 133. The external electrodes 230 are electrically connected to the substrate wiring layer 123 through a plurality of via conductors 143 that fill the via holes 143a.

Figure 2:
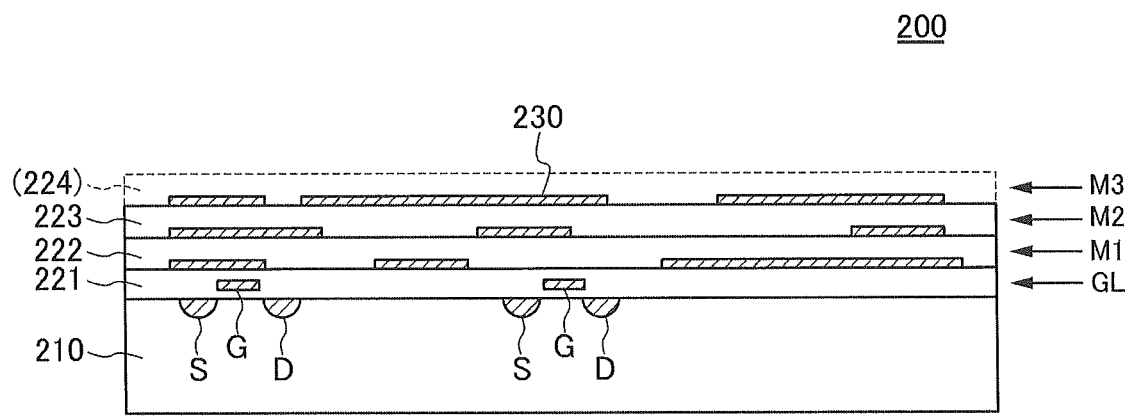
FIG. 2 is a schematic cross-sectional view illustrating the configuration of the semiconductor IC shown in FIG. 1.

FIG. 2 is a schematic cross-sectional view illustrating the configuration of the semiconductor IC 200.

As shown in FIG. 2, the semiconductor IC 200 includes a semiconductor substrate 210 that is made of silicon (Si) or gallium arsenide compound (GaAs), or the like. The semiconductor IC 200 further includes a plurality of chip wiring layers GL, M1, M2 and M3 that are formed on a surface of the semiconductor substrate 210, and interlayer insulation films 221, 222 and 223 that insulate the chip wiring layers. The chip wiring layer GL is located on the bottom layer. The chip wiring layer GL serves as a wiring layer on which a gate electrode G of a MOS transistor and the like are formed. On both sides of an area of the semiconductor substrate 210 that is covered with the gate electrode G, a source region S and a drain region D are formed. The gate electrode G, the source region S and the drain region D constitute a MOS transistor.

The chip wiring layers M1, M2 and M3 are wiring layers that are located on layers that are higher than the chip wiring layer GL. According to the present embodiment, the chip wiring layer M3 is placed on the top layer. The chip wiring layer M3 that is placed on the top layer may be directly exposed, or be covered with a passivation film 224. If the chip wiring layer M3 is directly exposed, then the external electrodes 230 are in direct contact with the resin layer 133. If the chip wiring layer M3 is covered with the passivation film 224, the passivation film 224 is located between the external electrodes 230 and the resin layer 133.

Figure 3:
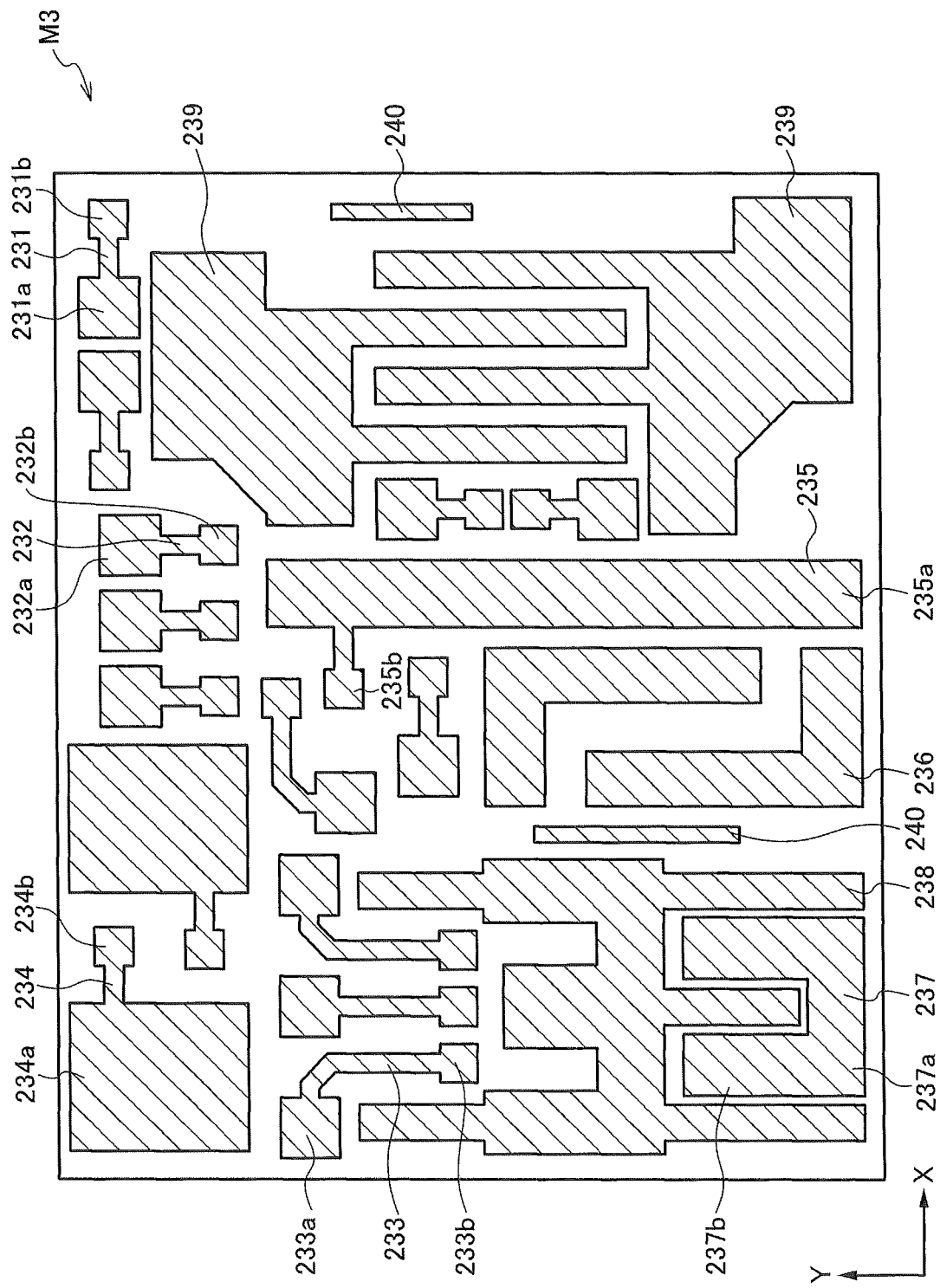
FIG. 3 is a plane view showing one example of wiring patterns formed on a chip wiring layer.

FIG. 3 is a plane view showing one example of wiring patterns formed on the chip wiring layer M3.

As shown in FIG. 3, a plurality of wiring patterns having various shapes and sizes are formed on the chip wiring layer M3. For example, a wiring pattern 231 is a wiring pattern that extends in an X-direction, and has a wide rectangular region 231a is provided at one end thereof and a wide rectangular region 231b is provided at the other end thereof. Similarly, a wiring pattern 232 is a wiring pattern that extends in a Y-direction, and has a wide rectangular region 232a is provided at one end thereof and a wide rectangular region 232b is provided at the other end thereof. A wiring pattern 233 is a J-shaped wiring pattern having a first electrode portion that extends in the X-direction and a second electrode portion that extends in the Y-direction. A wide rectangular region 233a is provided at one end of the wiring pattern 233, and a wide rectangular region 233b is provided at the other end of the wiring pattern 233.

The rectangular regions 231a, 232a and 233a are larger in area than the rectangular regions 231b, 232b and 233b. The rectangular regions 231a, 232a and 233a are regions that are used as external electrodes 230 shown in FIG. 1. The rectangular regions 231b, 232b and 233b are regions where via conductors that are used to electrically connect to the wiring layer M2 located at a lower layer are formed. The wiring patterns 231, 232 and 233 are relatively narrow in wiring width, and are used as wiring patterns for signals.

On the chip wiring layer M3, a large number of wiring patterns that are larger in area are also provided. For example, a wiring pattern 234 includes a linear portion that extends in the X-direction, and has a large-area rectangular region 234a that is provided at one end of the linear portion and a rectangular region 234b that is provided at the other end of the linear portion. A wiring pattern 235 includes a linear portion that extends in the X-direction, and has a linear wide region 235a that is provided at one end of the linear portion so as to extend in the Y-direction and a rectangular region 235b that is provided at the other end of the linear portion. A wiring pattern 236 is a L-shaped wiring pattern having a first wide electrode portion that extends in the X-direction and a second wide electrode portion that extends in the Y-direction. A wiring pattern 237 is a U-shaped wiring pattern having a first wide electrode portion 237a that extends in the X-direction and two second wide electrode portions 237b that extend in the Y-direction. Wiring patterns 238 and 239 are wiring patterns having complex shapes, including a plurality of first electrode portions that extend in the X-direction and a plurality of second wide electrode portions that extend in the Y-direction. The wiring patterns 239 also include diagonal portions.

The wiring patterns 234 to 239 all are relatively large in area, and are used as power-supply wiring patterns. In the wiring patterns 234 to 239, large-area portions and wide portions are regions that are used as the external electrodes 230 shown in FIG. 1. The rectangular regions 234b and 235b and the like are regions where via conductors that are used to electrically connect to the wiring layer M2 located at a lower layer are formed.

As shown in FIG. 3, there are no patterns that are defined as so-called pad electrodes on the chip wiring layer M3 that is located at the top layer. Only a large number of normal wiring is formed on the chip wiring layer M3. Therefore, an internal wiring lines 240 that are not connected to an external electrode within the wiring layer is also provided on the wiring layer M3.

Figure 4A:
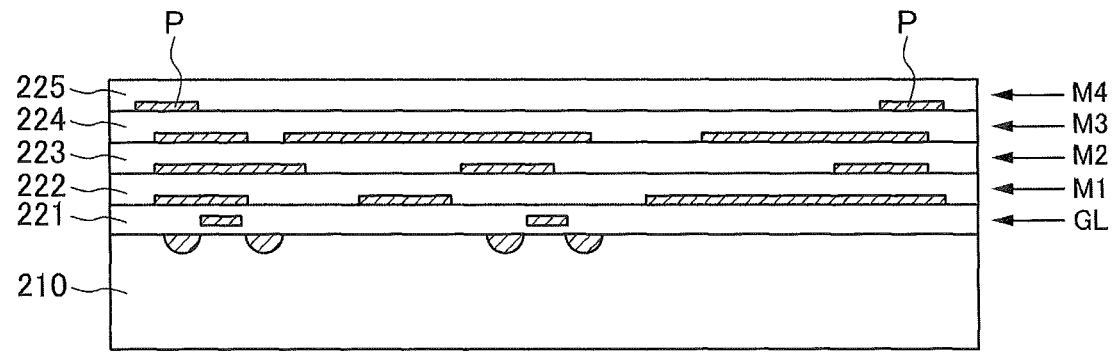
FIG. 4A is a schematic cross-sectional view illustrating the configuration of a conventional semiconductor IC.
Figure 4B:
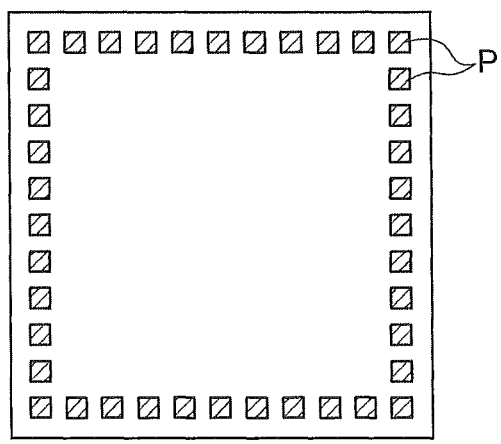
FIG. 4B is a schematic plane view illustrating the configuration of the conventional semiconductor IC.

In a conventional semiconductor IC, as shown in FIG. 4A, which is a schematic cross-sectional view, and FIG. 4B, which is a schematic plane view, on a top layer, a plurality of pad electrodes P having the same shape and size are arranged in a regular pattern. The pad electrodes P are used as external electrodes. In the case of the semiconductor IC 200 used in the present embodiment, the pad electrodes P do not exist. In the case of a conventional semiconductor IC with pad electrodes P as shown in FIG. 4A, a pad layer M4 needs to be provided on an upper layer that is higher than the wiring layer M3. According to the present embodiment, the pad layer M4 is not required. Therefore, the thickness of the semiconductor IC 200 can be further reduced by an amount equivalent to the film thicknesses of the pad layer M4 and passivation film 225, which covers the pad layer M4. Moreover, a process of forming the pad layer M4 and the passivation film 225 is not required, thereby making it possible to reduce the cost of manufacturing the semiconductor IC 200 accordingly.

Figure 5:
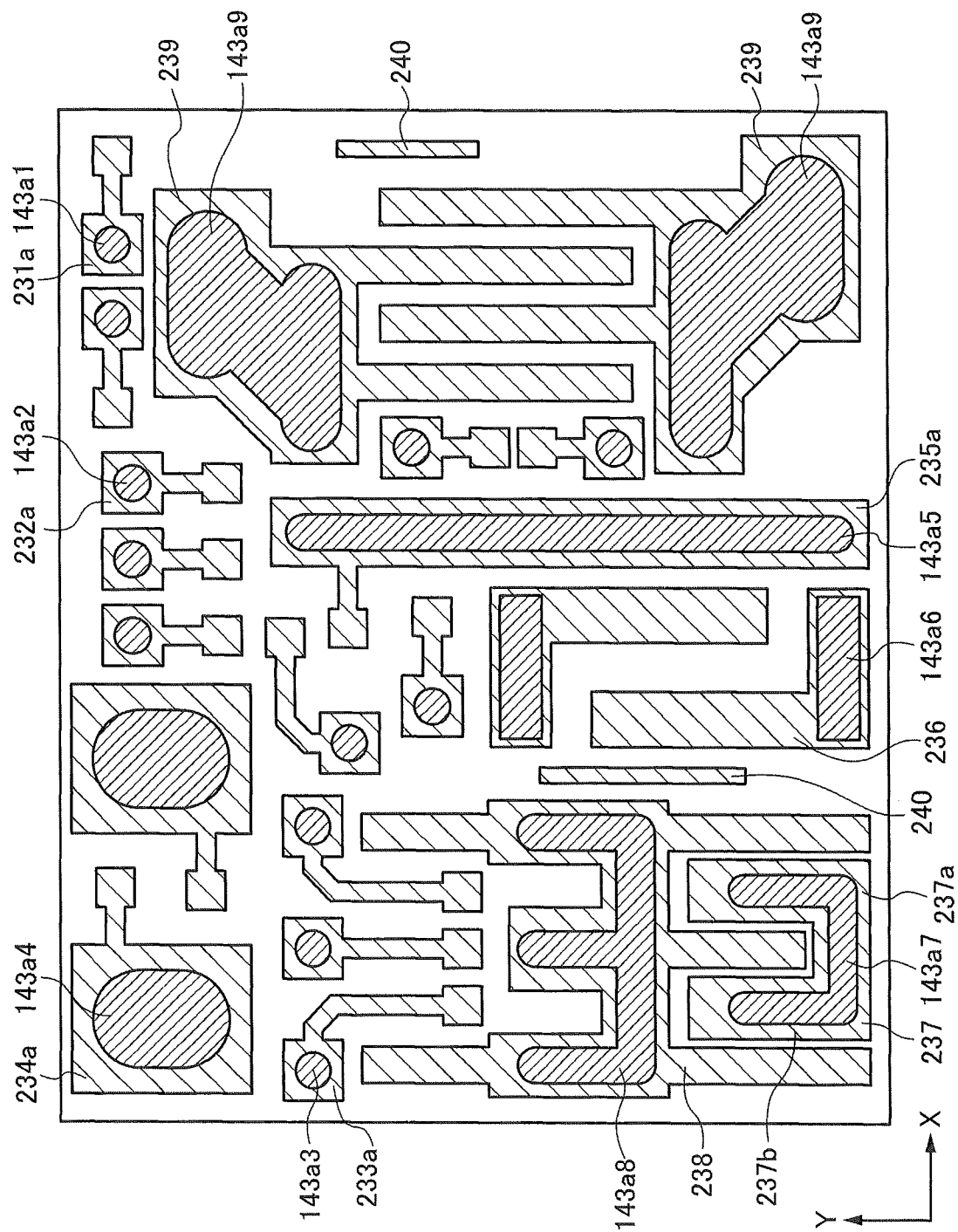
FIG. 5 is a plane view illustrating the positions, shapes, and sizes of via holes that are used to expose the chip wiring layer.

FIG. 5 is a plane view illustrating the positions, shapes, and sizes of via holes 143a that are used to expose the chip wiring layer M3.

As shown in FIG. 5, according to the present embodiment, via holes 143a have various shapes and sizes. More specifically, via holes 143a1 to 143a3 that are used to expose the rectangular regions 231a, 232a and 233a are substantially circular in shape. The via holes 143a1 to 143a3 are relatively small in size. A via hole 143a4 that is used to expose the large-area rectangular region 234a is elliptical in shape in line with the shape of the rectangular region 234a. The via hole 143a4 is larger in size than the via holes 143a1 to 143a3. A via hole 143a5 that is used to expose the linear wide region 235a is linear in shape in line with the shape of the wide region 235a. The via hole 143a5 is also larger in size than the via holes 143a1 to 143a3. A via hole 143a6 that is used to expose the wiring pattern 236 is provided at a position corresponding to the first wide electrode portion extending in the X-direction. The via hole 143a6 is also larger in size than the via holes 143a1 to 143a3.

A via hole 143a7 that is used to expose the wiring pattern 237 has a U-shape in line with the shape of the U-shaped wiring pattern 237. The via hole 143a7 is also larger in size than the via holes 143a1 to 143a3. More specifically, the via hole 143a7 includes a first opening that exposes the first electrode portion 237a and second openings that expose the second electrode portions 237b. The via hole 143a7 has a U-shape made by connecting the openings. A via hole 143a8 that is used to expose the wiring pattern 238, has an E-shape in line with the shape of part of the wiring pattern 238. The via hole 143a8 is also larger in size than the via holes 143a1 to 143a3. A via hole 143a9 that is used to expose the wiring pattern 239, has a shape of two ellipses combined in line with the shape of the wiring pattern 239. The via hole 143a9 is also larger in size than the via holes 143a1 to 143a3.

In that manner, while the wiring layer M3 is located below the pad layer M4 in the case of conventional semiconductor ICs, the wiring layer M3 is located at the top layer according to the present embodiment. Therefore, in line with the outer shapes of the wiring patterns formed on the wiring layer M3, it is possible to arbitrarily design the planar shapes of the via holes 143a. Thus, for example, a via conductor whose resistance should be lowered like power-supply via conductors can be made larger in size than via conductors for signals. Incidentally, needless to say, the shapes and sizes of all the via holes 143a are not required to be different from each other. All that is required is to make at least some of a plurality of via holes 143a different in shape or size from each other.

Figure 6A:
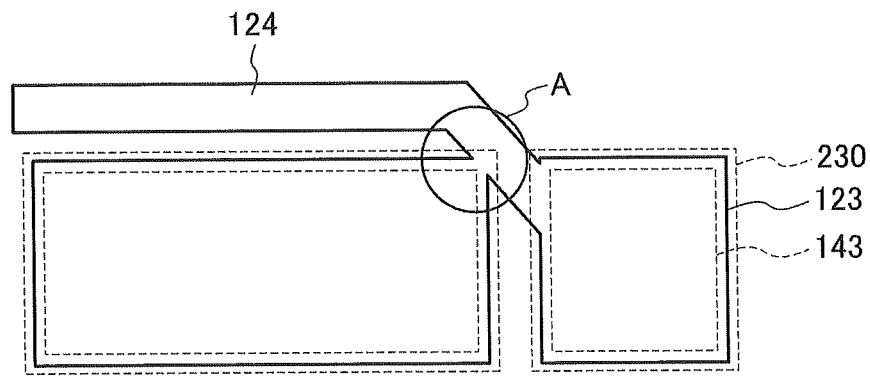
FIG. 6A is a schematic plane view illustrating a via conductor that is rectangular in shape.
Figure 6B:
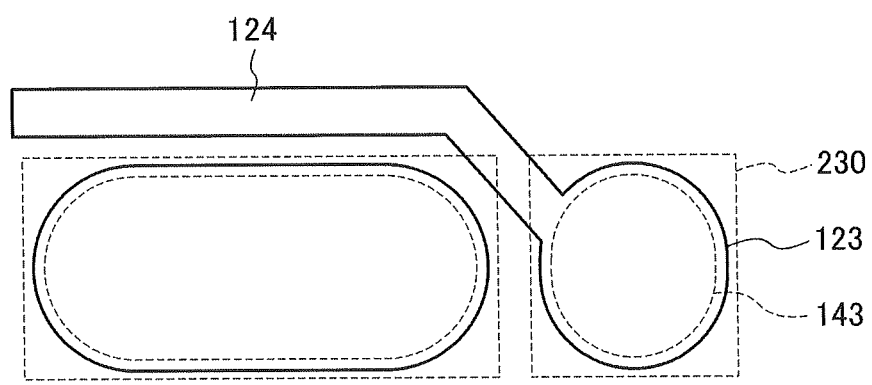
FIG. 6B is a schematic plane view illustrating a via conductor that is ellipse in shape.

Incidentally, the planar shapes of via conductors 143 are preferably circular or elliptical with no corners, rather than rectangular. As shown in FIG. 6A, if a via conductor 143 is rectangular in shape, a wiring line 124 that is led out from the via conductor 143 is likely to interfere with the adjacent via conductor 143 as indicated by reference symbol A. As shown in FIG. 6B, if the via conductor 143 is in a round shape with no corners, such interference is unlikely to occur, contributing to an improvement in the flexibility of design of wiring lines. However, as shown in FIG. 6A, the rectangular via conductor 143 with corners is larger in size, and is advantageous to reducing the resistance. Therefore, a via conductor 143 that is at a position where interference with wires does not occur, particularly a power-supply via conductor 143, may be rectangular in shape as shown in FIG. 6A.

A method of producing the circuit board 100 of the present embodiment will be described.

FIGS. 7 to 13 are process charts illustrating a method of producing the circuit board 100 of the present embodiment.

Figure 7:
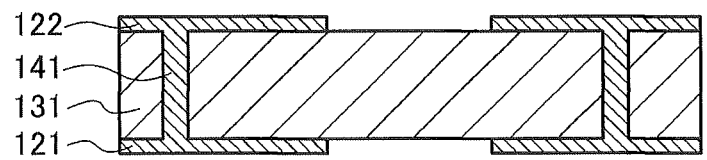
FIGS. 7 to 13 are process charts illustrating a method of manufacturing the circuit board according to the embodiment of the present invention.

First, as shown in FIG. 7, a substrate or work board, i.e. both-sided CCL (Copper Clad Laminate), is prepared. The substrate is made by bonding a metal film such as copper foil to both sides of the resin layer 131 made of glass epoxy or the like. Then, via holes are made by a drill or laser irradiation in the resin layer 131. Furthermore, electroless plating and electrolytic plating is carried out to form via conductors 141 inside the via holes. Then, a well-known technique is used to carry out patterning of the metal film, thereby forming the substrate wiring layers 121 and 122.

Incidentally, the substrate wiring layers 121 and 122 are not limited to the above Cu, other metal materials, e.g. metal conductive materials such as Au, Ag, Ni, Pd, Sn, Cr, Al, W, Fe, Ti, and SUS materials, are available. However, in terms of conductivity and cost, Cu is preferably used. The same is true for the substrate wiring layer 123 described later.

Materials used for the resin layer 131 are not specifically restricted, and those that can be molded into a sheet or film are available. In addition to the above glass epoxy, the materials for example include: vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+active ester curing resin, polyphenylene ether resin (polyphenylene oxide resin), curable polyolefin resin, benzocyclobutene resin, polyimide resin, aromatic polyester resin, aromatic liquid crystal polyester resin, polyphenylene sulfide resin, polyetherimide resin, polyacrylate resin, polyether ether ketone resin, fluorine resin, epoxy resin, phenol resin, or benzoxazine resin; or materials made by adding, to the above resins, silica, talc, calcium carbonate, magnesium carbonate, aluminum hydroxide, magnesium hydroxide, aluminum borate whisker, potassium titanate fiber, alumina, glass flake, glass fiber, tantalum nitride, aluminum nitride, or the like; or materials made by adding, to the above resins, metal oxide powder containing at least one of metals, magnesium, silica, titanium, zinc, calcium, strontium, zirconium, tin, neodymium, samarium, aluminum, bismuth, lead, lanthanum, lithium, or tantalum; or materials made by blending, into the above resins, resin fibers such as glass fiber or aramid fiber, and the like; or materials made by impregnating glass cloth, aramid fiber, non-woven fabric, or the like with the above resins; and other materials. In terms of electrical properties, mechanical properties, water absorbency, reflow resistance and the like, the materials are appropriately selected for use.

Figure 8:
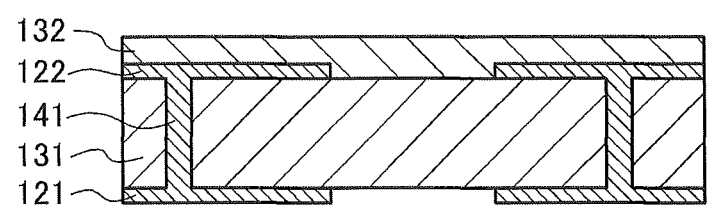

Then, as shown in FIG. 8, a resin sheet or the like is stacked on a surface of the resin layer 131 by, for example, vacuum-crimping or the like. The resin layer 132 is formed as a result. In this manner, a so-called RCC (Resin Coated Copper) structure is obtained.

Figure 9:
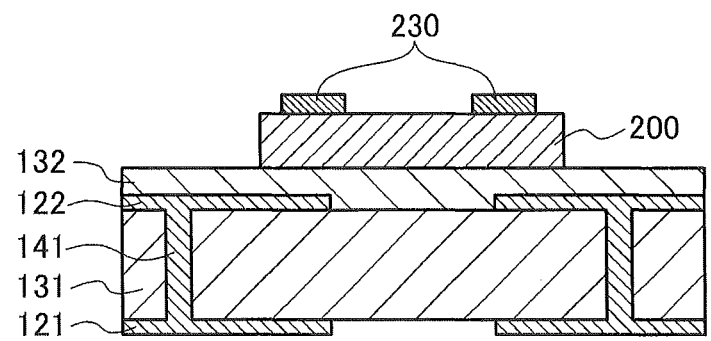

Then, as shown in FIG. 9, the semiconductor IC 200 that is made thin and is for example 200 μm or less in thickness or more preferably about 50 to 100 μm is placed face-up on the surface of the resin layer 132. As described above, the semiconductor IC 200 is in a bare-chip state. The wiring layer M3 that is positioned at the top of the wiring layers is exposed, or the chip wiring layer M3 is covered with a passivation film. A process of making the semiconductor ICs 200 thin is preferably carried out for a large number of semiconductor ICs 200 in a wafer state at once. As for the order that the processes are carried out, first a back side of the wafer is preferably ground before dicing is carried out to separate the wafer into individual semiconductor ICs 200. According to another method, dicing may be carried out to separate the wafer into individual semiconductor ICs 200 before a grinding process is performed to make the semiconductor ICs 200 thin, or the wafer may be cut in half. In this case, the back side is preferably ground after the main surfaces of the semiconductor ICs 200 are covered with thermosetting resin or the like. In that manner, the methods of making the semiconductor ICs 200 thin are not specifically limited, and various methods may be available. After the back sides of the semiconductor ICs 200 are ground, roughening is preferably carried out by etching, plasma processing, laser processing, blasting, polishing by grinder, buffing, chemical treatment, or the like. As a result, it is possible to improve the adhesion with the resin layer 132.

Figure 10:
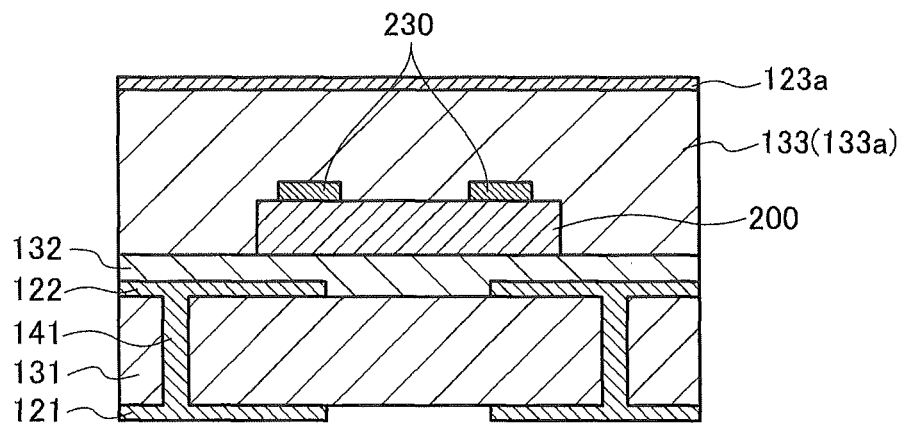

Then, as shown in FIG. 10, an uncured or semi-cured thermosetting resin 133a on which a metal film 123a is formed is put on the resin layer 132. In this manner, the semiconductor IC 200 is embedded in the thermosetting resin 133*a*. Then, hot pressing is carried out by pressing means to cure the uncured or semi-cured thermosetting resin 133*a*, thereby forming the resin layer 133. As a result, the semiconductor IC 200 and the metal film 123*a* adhere securely to the resin layer 133. Incidentally, after the uncured or semi-cured thermosetting resin 133*a* is placed on the resin layer 132, the metal film 123*a* may be formed by electroless plating and electrolytic plating.

Figure 11:
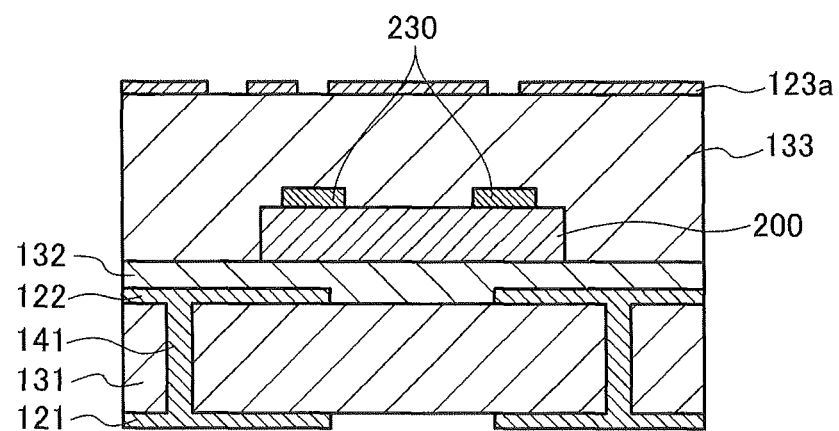
Figure 12:
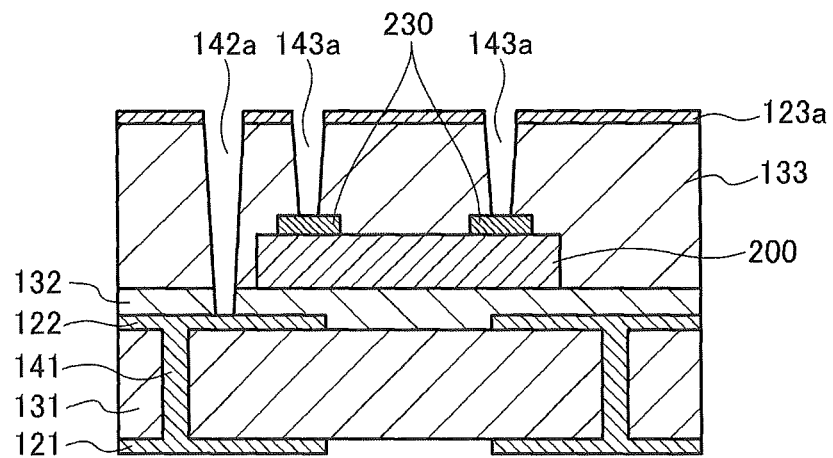

Then, as shown in FIG. 11, patterning is carried out to remove portions of the metal film 123*a* that are immediately above the external electrodes of the semiconductor IC 200. Then, as shown in FIG. 12, the remaining portions of the metal film 123*a* are used as a mask, and via holes 142*a* and 143*a* are formed in the resin layer 133. As a result, a portion of the substrate wiring layer 122 is exposed through the via hole 142*a*, and portions of the external electrodes 230 of the semiconductor IC 200 are exposed through the via holes 143*a*. The way the via holes 142*a* and 143*a* are formed is not specifically limited, it is preferred that blasting or laser processing, particularly blasting, be used. The reason is that the use of blasting makes it possible to form a large number of via holes 142*a* and 143*a* with different shapes, sizes, and depths at once. According to the present embodiment, the via holes 143*a* of various shapes and sizes need to be formed. In the case of laser processing, the same areas might be irradiated twice with laser beams, and there are fears the semiconductor IC 200 could be damaged, and a manufacturing lead time would increase. Among various kinds of blasting, in particular, wet blasting is preferably selected. The use of wet blasting makes it possible to prevent the charge resulting from static electricity that can be caused when the via holes 142*a* and 143*a* are made, it is therefore possible to protect the semiconductor IC 200 from electrostatic discharge damage.

Figure 13:
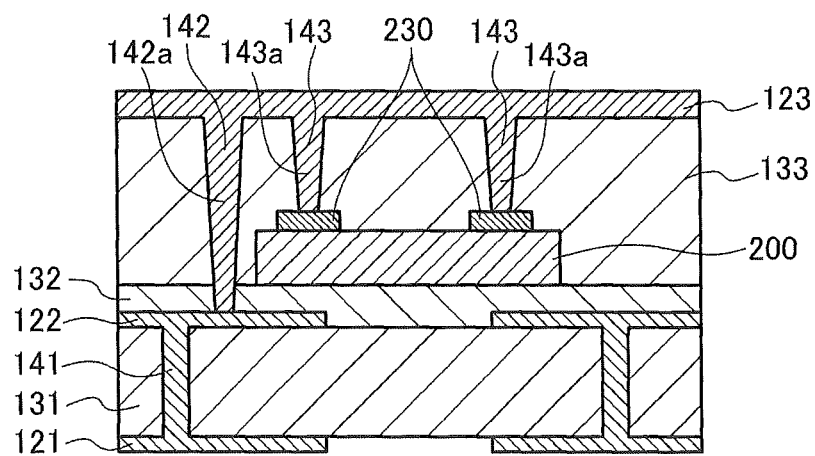

Then, as shown in FIG. 13, electroless plating is carried out to form a metal film on inner walls of the via holes 142*a* and 143*a*. Then, electrolytic plating is carried out to form the via conductors 142 and 143 and the substrate wiring layer 123. Then, patterning is carried out to form the substrate wiring layer 123 into a desired shape. As a result, the circuit board 100 shown in FIG. 1 is completed. Incidentally, during the patterning of the substrate wiring layer 123, upper portions of the via conductors 142 and 143 are preferably covered with a mask to avoid etching of the via conductors 142 and 143. In other words, portions of the substrate wiring layer 123 that cover the via conductors 142 and 143 are preferably larger in size than the via conductors 142 and 143. If the portions of the substrate wiring layer 123 are smaller in size than the via conductors 142 and 143, an etching solution used for patterning of the substrate wiring layer 123 would get into the via, resulting in an increase in via connection resistance. Therefore, the portions of the substrate wiring layer 123 that cover the via conductors 142 and 143 are preferably so designed as to be larger in size than the via conductors 142 and 143 to a certain extent.

As described above, according to the present embodiment, the semiconductor IC 200 with no pad layers is embedded in a resin substrate. Therefore, the shape and size of the via conductors 143 can be arbitrarily designed in line with the shape and size of the external electrodes 230. Thus, for example, a power-supply via conductor 143 can be made larger in size than a via conductor 143 for signals. As a result, the resistance on power supply can be lowered. Moreover, since no pad layers are provided, it is possible to reduce the cost of producing the semiconductor IC 200, as well as to make the circuit board 100 thinner as a whole.

It is apparent that the present invention is not limited to the above embodiments, but may be modified and changed without departing from the scope and spirit of the invention.

For example, according to the present embodiment, one semiconductor IC 200 is embedded in the resin substrate 110. However, the number of semiconductor ICs embedded is not limited to one, two or more may be embedded. If two or more semiconductor ICs are embedded, the two or more semiconductor ICs may be embedded in the same resin layer, or in different resin layers. If the semiconductor ICs are embedded in different resin layers, the processes of FIGS. 9 to 13 are repeated.

According to the above embodiment, the semiconductor IC 200 is embedded in the resin substrate 110. However, an electronic component embedded in the resin substrate is not limited to the semiconductor IC. For example, other electronic components, such as passive components like varistor, resistor, and capacitor, may be embedded. However, since the semiconductor ICs have a large number of external electrodes of different types, such as power-supply external electrodes and external electrodes for signals, embedding the semiconductor ICs is most effective in the case of the present invention.

What is claimed is:

1. A circuit board, comprising:
   a resin substrate including a substrate wiring layer and a resin layer, the substrate wiring layer being an uppermost wiring layer of the circuit board; and
   an electronic component embedded in the resin substrate and including a first wiring layer and a second wiring layer, the first wiring layer and the second wiring layer being stacked one another, the first wiring layer being an uppermost layer of the electronic component, the second wiring layer being disposed directly below the first wiring layer, the first wiring layer including a first external electrode,
   wherein the resin substrate includes a first via hole that directly connects the first external electrode and a first via conductor embedded in the first via hole to electrically connect the substrate wiring layer of the resin substrate to the first external electrode of the electronic component,
   wherein the first external electrode of the electronic component comprises a first section and a second section, an area of the first section is larger than an area of the second section,
   wherein 1) the first section of the first external electrode directly contacts the first via conductor of the resin substrate to electrically connect the substrate wiring layer of the resin substrate to the first external electrode of the electronic component and 2) the second section of the first external electrode A) contacts a first internal via conductor that connects the first external electrode of the first wiring layer to the second wiring layer of the electronic component and B) directly contacts the resin layer of the resin substrate without an intervention of another layer between the second section of the electronic component and the resin layer of the resin substrate,
   wherein the first wiring layer includes a second external electrode,
   wherein the resin substrate includes a second via hole that directly connects the second external electrode and a second via conductor embedded in the second via hole to electrically connect the substrate wiring layer of the resin substrate to the second external electrode of the electronic component, wherein the second external electrode of the electronic component comprises a third section and a fourth section, an areas of the third section is larger than an area of the fourth section, wherein 1) the third section of the second external electrode directly contacts the second via conductor of the resin substrate to electrically connect the substrate wiring layer of the resin substrate to the second external electrode of the electronic component and 2) the fourth section of the second external electrode A) contacts a second internal via conductor that connects the second external electrode of the first wiring layer to the second wiring layer of the electronic component and B) directly contacts the resin layer of the resin substrate without an intervention of another layer between the fourth section of the electronic component and the resin layer of the resin substrate, wherein the area of the first section of the first external electrode of the electronic component is larger than the area of the third section of the second external electrode of the electronic component, and wherein the first via hole is larger than the second via hole.

2. The circuit board as claimed in claim 1, wherein the electronic component includes a semiconductor IC.

3. The circuit board as claimed in claim 2, wherein the semiconductor IC includes an internal wiring line provided on the first wiring layer, the internal wiring line being free from connected to any of the external electrodes at least on the first wiring layer.

4. The circuit board as claimed in claim 1, wherein the first external electrode includes a power-supply electrode, and the second external electrode includes an electrode for a signal.

5. The circuit board as claimed in claim 1, wherein the first section of the first external electrode of the electronic component has a first shape, wherein the first via hole of the resin substrate has a first planar shape that is in line with an outer shape of the first shape of the first section of the first external electrode of the electronic component, wherein the third section of the second external electrode of the electronic component has a second shape, wherein the first shape differs from the second shape, and wherein the second via hole of the resin substrate has a second planar shape that is in line with an outer shape of the second shape of the third section of the second external electrode of the electronic component.

6. The circuit board as claimed in claim 5, wherein the first external electrode includes a first electrode portion extending in a first direction and a second electrode portion extending in a second direction that crosses the first direction, and wherein the first via hole includes a first opening exposing the first electrode portion and a second opening exposing the second electrode portion.

7. The circuit board as claimed in claim 1, wherein the first and second via holes expose an upper surface of the first external electrode and an upper surface of the second external electrode, respectively.

8. The circuit board as claimed in claim 1, wherein the first via hole exposes a part of the first external electrode below a bottom surface of the first via conductor, and wherein the second via hole exposes a part of the second external electrode below a bottom surface of the second via conductor.

9. The circuit board as claimed in claim 1, wherein the first external electrode is electrically connected to the substrate wiring layer through the first via conductor that fills the first via hole above the first external electrode, and wherein the second external electrode is electrically connected to the substrate wiring layer through the second via conductor that fills the second via hole above the second external electrode.

10. The circuit board as claimed in claim 1, wherein the resin layer is disposed on a surface of the first external electrode, the one of the via conductors being disposed on the surface of the first external electrode.

11. The circuit board as claimed in claim 10, wherein the internal via conductor is disposed on another surface of the first external electrode.

12. The circuit board as claimed in claim 1, wherein the resin layer abuts a surface of the first external electrode.

13. The circuit board as claimed in claim 12, wherein the internal via conductor abuts another surface of the first external electrode.

14. A circuit board, comprising:

a resin layer including a first via hole;

a first via conductor embedded in the first via hole; and a semiconductor IC including a first wiring layer and a second wiring layer stacked one another, the first wiring layer being an uppermost layer of the semiconductor IC, the second wiring layer being located below the first wiring layer, the first wiring layer including a first pattern and a second pattern, wherein the first via hole of the resin layer is directly connected to a first section of the first pattern to electrically connect the first pattern to the first via conductor, wherein a first internal via conductor of the semiconductor IC connects to a second section of the first pattern to connect the first pattern of the first wiring layer to the second wiring layer of the semiconductor IC, wherein the second section of the first pattern is in contact with the resin layer without an intervention of another layer, wherein an area of the first section of the first pattern is larger than an area of the second section of the first pattern, wherein the second pattern is entirely covered with the resin layer so as to be free from contacting any of the via conductors, wherein a second internal via conductor of the semiconductor IC is in contact with the second pattern to connect the second pattern of the first wiring layer to the second wiring layer of the semiconductor IC, wherein the first wiring layer includes a third pattern, wherein a planar shape of the third pattern differs from a planar shape of the first pattern, wherein the resin layer includes a second via hole, wherein a second via conductor is embedded in the second via hole, wherein the second via hole of the resin layer is directly connected to a third section of the third pattern to electrically connect the third pattern to the second via conductor, wherein a third internal via conductor of the semiconductor IC connects to a fourth section of the third pattern to connect the third pattern of the first wiring layer to the second wiring layer of the semiconductor IC, wherein the fourth section of the third pattern is in contact with the resin layer without an intervention of another layer, wherein an area of the third section of the third pattern is larger than an area of the fourth section of the third pattern, and wherein the first and second via conductors are different in planar shape from each other.

15. The circuit board as claimed in claim 14, further comprising:

a substrate wiring layer disposed on an upper surface of the resin layer, the substrate wiring layer being an uppermost wiring layer of the circuit board.

16. The circuit board as claimed in claim 15, wherein the first via hole connects the surface of the first pattern to the substrate wiring layer.

17. The circuit board as claimed in claim 15, wherein the first via hole directly connects the surface of the first pattern to the substrate wiring layer.

* * * * *